(12) United States Patent
Kitazawa

(10) Patent No.: US 10,461,058 B2
(45) Date of Patent: Oct. 29, 2019

(54) METHOD AND APPARATUS FOR MANUFACTURING ELECTRONIC DEVICE USING DEVICE CHIP

(71) Applicant: SHASHIN KAGAKU CO., LTD., Kyoto (JP)

(72) Inventor: Hiroyuki Kitazawa, Kyoto (JP)

(73) Assignee: SHASHIN KAGAKU CO., LTD., Kyoto (JP)

( * ) Notice: Subject to any disclaimer, the term of this patent is extended or adjusted under 35 U.S.C. 154(b) by 0 days.

(21) Appl. No.: 16/087,239

(22) PCT Filed: Feb. 27, 2017

(86) PCT No.: PCT/JP2017/007571
§ 371 (c)(1),
(2) Date: Sep. 21, 2018

(87) PCT Pub. No.: WO2017/163775
PCT Pub. Date: Sep. 28, 2017

(65) Prior Publication Data
US 2019/0067237 A1 Feb. 28, 2019

(30) Foreign Application Priority Data
Mar. 25, 2016 (JP) .................. 2016-062627

(51) Int. Cl.
*H01L 23/00* (2006.01)
*G09F 9/33* (2006.01)
(Continued)

(52) U.S. Cl.
CPC .............. *H01L 24/743* (2013.01); *G09F 9/33* (2013.01); *H01L 24/83* (2013.01);
(Continued)

(58) Field of Classification Search
CPC .......... G09F 9/33; H01L 24/743; H01L 24/83; H01L 2924/06; H01L 2924/12041; H01L 33/0095; H05K 13/04; H05K 13/0404
(Continued)

(56) References Cited

U.S. PATENT DOCUMENTS

| | | |
|---|---|---|
| 5,952,713 A | 9/1999 | Takahira et al. |
| 2004/0182261 A1 | 9/2004 | Fernfors et al. |

(Continued)

FOREIGN PATENT DOCUMENTS

| | | |
|---|---|---|
| JP | H08-230367 A | 9/1996 |
| JP | 2007-027551 A | 2/2007 |
| JP | 2009-152387 A | 7/2009 |

OTHER PUBLICATIONS

Notice of grant of JP2016-062627.*
(Continued)

*Primary Examiner* — Sonya M Sengupta
(74) *Attorney, Agent, or Firm* — Fitch, Even, Tabin & Flannery LLP

(57) ABSTRACT

[Object] To provide a method and an apparatus for manufacturing electronic devices by transferring the device chips from one substrate for producing device chips to the other substrate for a product having a large display.
[Means of Realizing the Object] A substrate having a plurality of device chips is brought into contact with a first drum including a selective adhesive region, the device chips are transferred by making the device chips be adhered to the selective adhesive layer of the first drum and separating at least part of the device chips from the substrate by rotating the first drum, then, the device chips on the first drum are made to be come into contact with the other substrate for the product, and the device chips are transferred to the substrate for the product by rotating the first drum. Additionally, the front-and-rear relation for the surfaces may be inversed by, (Continued)

after the device chips on the first drum are transferred to the second drum, transferring the device chips on the second drum to the substrate for the product.

10 Claims, 10 Drawing Sheets

(51) Int. Cl.
  *H05K 13/04* (2006.01)
  *H01L 33/00* (2010.01)
(52) U.S. Cl.
  CPC ......... *H01L 33/0095* (2013.01); *H05K 13/04* (2013.01); *H05K 13/0404* (2013.01); *H01L 2924/06* (2013.01); *H01L 2924/12041* (2013.01)
(58) Field of Classification Search
  USPC .................................................. 156/247, 446
  See application file for complete search history.

(56) References Cited

U.S. PATENT DOCUMENTS

2006/0128057 A1    6/2006  Lu et al.
2007/0020801 A1    1/2007  Ishikawa et al.

OTHER PUBLICATIONS

Notice of grant of JP2017-240450.*
Written Opinion of PCT/JP2017/007571.*
International Search Report for PCT/JP2017/007571, dated May 23, 2017 and English translation submitted herewith (4 pages).
Decision to Grant a Patent in JP 2016-062627 dated Mar. 14, 2018 and English language machine translation thereof.
Notification of Reasons for Refusal in JP 2016-062627 dated Nov. 7, 2017 and English language machine translation thereof.
Amendment in JP 2016-062627 dated Dec. 15, 2017 and English language machine translation thereof.
Decision to Grant a Patent in JP 2017-240450 dated Jun. 19, 2018 and English language machine translation thereof.

* cited by examiner

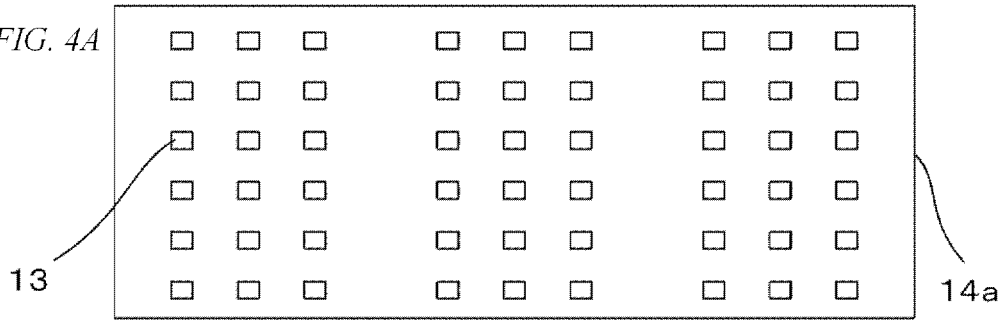
FIG. 4A
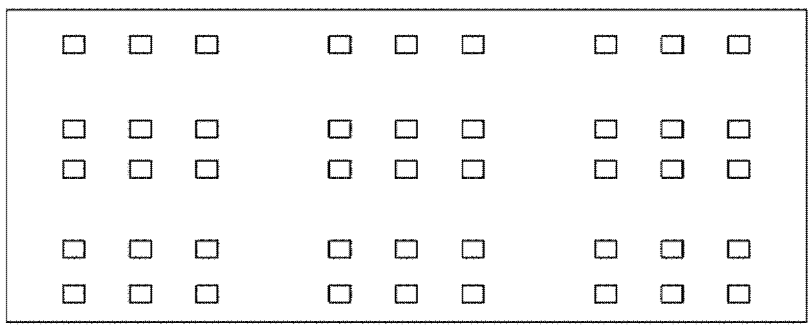
FIG. 4B
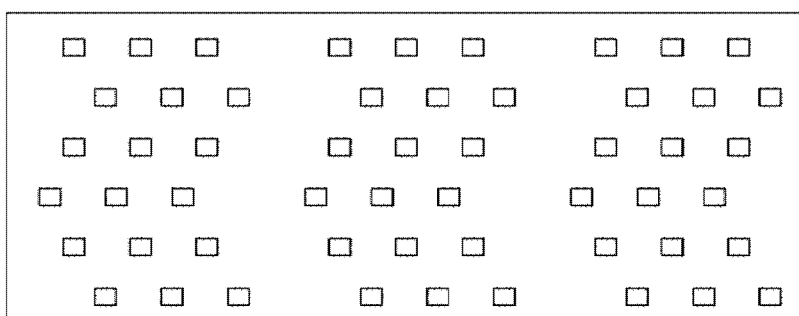
FIG. 4C
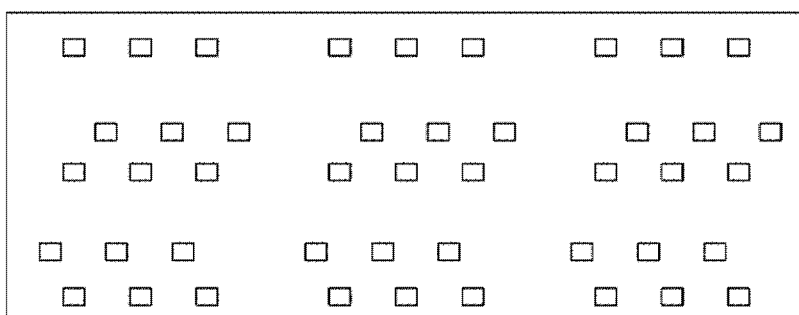
FIG. 4D
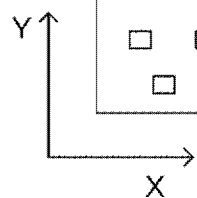

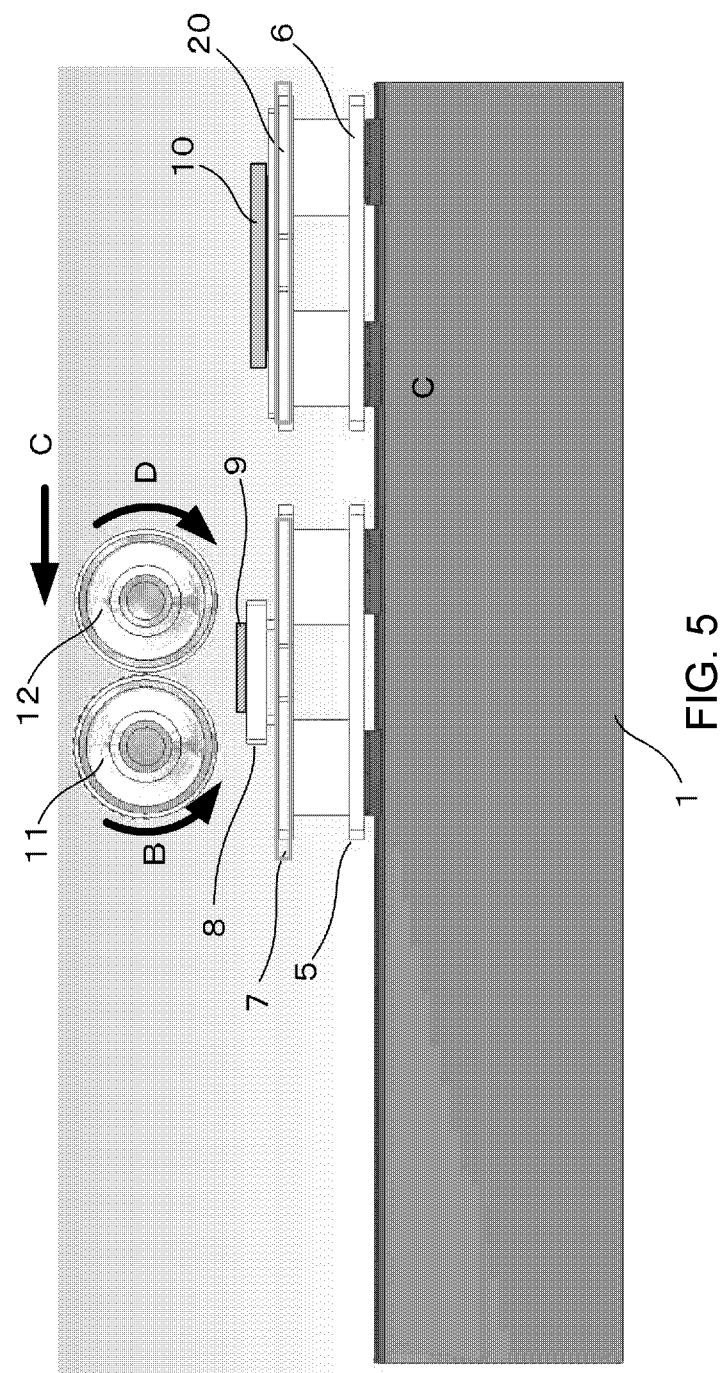

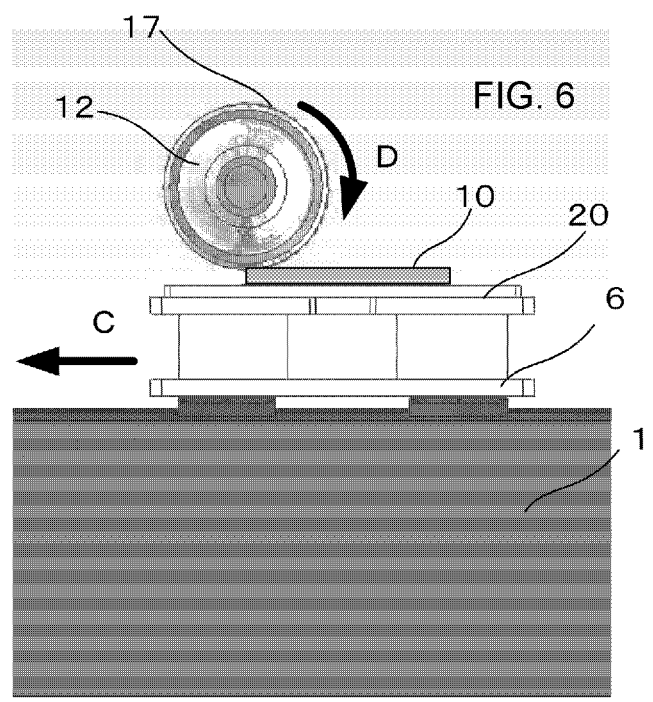

FIG. 10A
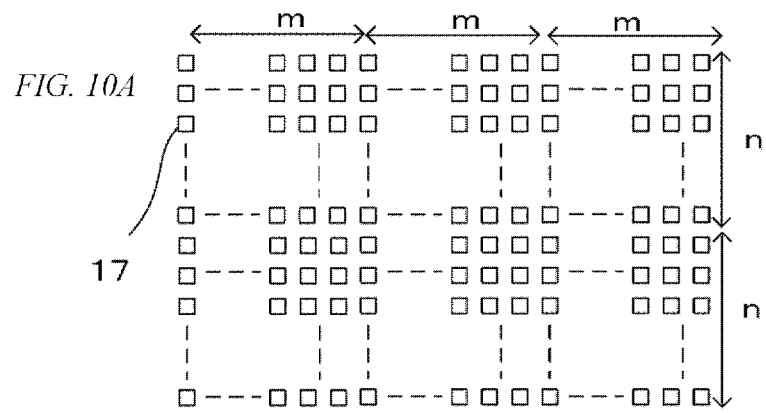
FIG. 10B
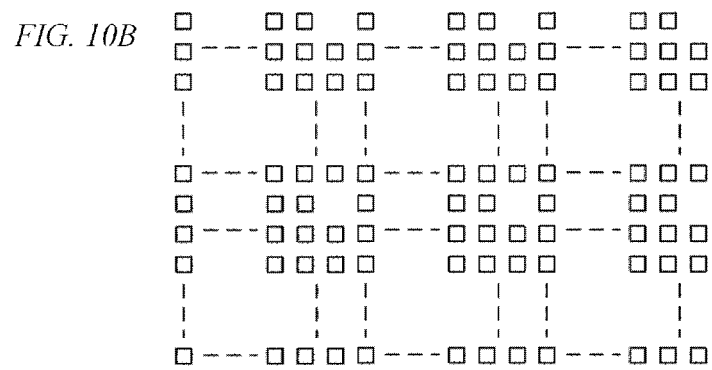
FIG. 10C
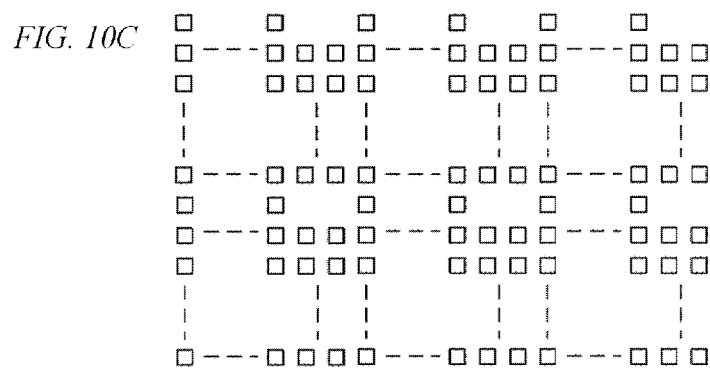
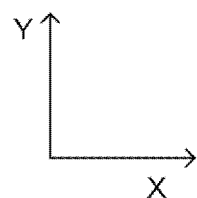

US 10,461,058 B2

METHOD AND APPARATUS FOR MANUFACTURING ELECTRONIC DEVICE USING DEVICE CHIP

CROSS-REFERENCE TO RELATED APPLICATIONS

This application is a U.S. national phase application filed under 35 U.S.C. § 371 of International Application No. PCT/JP2017/007571, filed Feb. 27, 2017, which claims priority from Japanese Patent Application No. 2016-062627, filed Mar. 25, 2016, designating the United States, which are hereby incorporated herein by reference in their entirety.

BACKGROUND

Technical Field

The present invention relates methods for manufacturing electronic devices using device chips. In particular, the present invention relates to a method for manufacturing electronic devices by arranging a plurality of device chips whose sizes are finer than the size of the electronic devices, and an apparatus for manufacturing the same.

Background Art

A display apparatus using light-emitting diodes (LEDs), which are light emitting elements, includes a plurality of three-primary-color (RGB) LEDs that are arranged on a substrate for a display screen of the display apparatus. The RGB LEDs constitute each pixel, each pixel emits light according to image signals, and this enables an image to be displayed on the display screen as a whole.

Each pixel determines a resolution of the display screen. The higher the resolution (the finer the pixel) is, the smoother the image is reproduced. The larger the pixel elements are, the lower the display resolution, thereby resulting to a coarse image, for a large-screen display apparatus.

LEDs are difficult to be manufactured directly on a substrate of the display screen because of the size of the substrate and the problems in manufacturing process influenced by the size. In one example, the display apparatus is thus manufactured by transferring the LEDs, which are manufactured on the compound semiconductor substrate, to the display screen substrate corresponding to each pixel.

For an active matrix type liquid crystal display apparatus with a large-screen, Patent Document 1 discloses a method for manufacturing a liquid crystal display apparatus by preparing a plurality of thin-film transistor (TFT) elements on a first substrate, by transcribing (transferring as they are) the TFT elements selectively to a second substrate for the liquid crystal display apparatus, and by sealing a crystal material between the second substrate and a opposing third substrate where a color filter is disposed.

Patent Document 1 also discloses a technology of removing the electronic device chips, such as TFT elements, manufactured on the substrate using a plate-like relay substrate, and transferring the TFT elements transcribed on the relay substrate to a substrate for a product.

Patent Document 2 discloses a technology of press-bonding electronic components onto a printed circuit pattern one by one using a chip mounter.

RELATED ART DOCUMENTS

[Patent Document 1]: Japanese Unexamined Patent Application Publication No. 2009-152387

[Patent Document 2]: Japanese Unexamined Patent Application Publication No. H08-230367

DISCLOSURE OF THE INVENTION

Problems to be Solved by the Invention

When electronic device chips are separated and transferred from the first substrate for producing the electronic device chips to the relay substrate and are transferred to the second substrate for an electronic device product, a yield degradation caused by separation error (defect by lacking) may frequently occur, because the larger the relay substrate is, the larger difference of a separating force is used.

Although Patent Document 1 discloses a method for improving a separating property, the manufacturing process is complicated and costly. Additionally, the disclosed process requires to be consistently incorporated into a manufacturing process of electronic device chips, and thus, the cost for developing the incorporation is increased.

Furthermore, when the electronic device chips are transferred to a device chip substrate from a relay substrate, for a large or plate-like relay substrate, the entire surface of the relay substrate is brought into contact with the device chip material substrate surface or the substrate for the product, and a larger pushing length is used. Consequently, the distortion caused by pushing to the relay substrate is increased.

The deformation quantity is increased especially in the outer edge portions of the substrates, because unlike the center portion the outer edge portion does not have any structure that suppresses being extended. Consequently, it makes difficult to suppress the deformation caused by distortion in both center and outer edge portion, when fine device chips are transferred.

In one example, if micro LEDs whose sizes of the electronic device chips to be transferred are about 10×30 μm and where the chips are aligned at an interval of about 5 μm are manufactured, precise alignment of the above-mentioned micron order is difficult over the entire relay substrate.

Furthermore, Patent Document 1 does not disclose a technology for manufacturing a display apparatus using a larger substrate for the product than the substrate where electronic device chips are prepared, and thus, a display apparatus with a large screen is difficult to be manufactured using the above mentioned technology.

Alternatively, even if a plurality of substrates (glass substrates) where electronic device chips (TFT elements) are formed are prepared, and the electronic chips are repeatedly separated and transferred from the substrates (glass substrates) to a substrate for a product, the process significantly prolongs tact time and it also increases the cost of manufacturing.

Patent Document 2 discloses a method of transferring device chips (electronic components) one by one to a board for the product using a chip mounter. However, when this method is used, positioning accuracy may be differed depending on individual device chip and also the tact time may be significantly increased. It may be thus not unrealistic to employ this method when a large substrate is manufactured, and it may furthermore increase the manufacturing cost.

The conventional vacuum suction/chucking system for gripping device chips by a pickup head for the chip mounter constrains the device chip sizes and significant design change, such as a mechanism change of the pickup head, may be required in order to transfer fine chips with high tact.

The present invention has been made in the light of the above circumstances, and its primary object is to provide a method and an apparatus for manufacturing electronic devices by transferring device chips to a substrate for a product or the like at low cost and high arrangement accuracy.

Means of Solving the Problems

According to one embodiment of the present invention, a method of manufacturing electronic devices includes a preparation step for preparing a first substrate having a first adhesive layer and a second substrate having a second adhesive layer, the first adhesive layer including a surface where a plurality of device chips are adhered, a first take-out step for making at least part of the device chips on the first substrate come into contact with and adhere to at least part of a selective adhesive region on a third adhesive layer of a first drum and for separating at least part of the device chips from the first substrate by rotating the first drum, and a first transfer step for making the device chips on the selective adhesive region come into contact with and adhere to the second adhesive layer of the second substrate and for separating the device chips from the selective adhesive region by rotating the first drum.

In the embodiment of the present invention, an adhesion force between the first adhesive layer and the device chips may be weaker than an adhesion force between the selective adhesive region and the device chips, and the adhesion force between the selective adhesive region and the device chips may be weaker than an adhesion force between the second adhesive layer and the device chips.

Such a use of a manufacturing method may enable a separating force for separating the plurality of device chips from the first substrate where the device chips are adhered to be further reduced, and the uniformity of the separating force to be enhanced. It may improve the arrangement accuracy of the device chips on the second substrate, may shorten the tact time for transferring the device chips, and further may surely transfer the device chips by controlling the adhesion force.

Furthermore, the device chips do not require to be manufactured directly on the second substrate, and thus, the second substrate is not subject to any limitation for the process of manufacturing the device chips, such as heat resistance and chemical resistance. In addition to it, since such a limitation is not necessary, neither the second substrate may be deformed nor a positioning deviation may occur.

According to one embodiment of the present invention, a method of manufacturing electronic devices includes a preparation step for preparing a first substrate having a first adhesive layer and a second substrate having a second adhesive layer, the first adhesive layer including a surface where a plurality of device chips are adhered, a first take-out step for making at least part of the device chips on the first substrate come into contact with and adhere to at least part of a selective adhesive region on a third adhesive layer of a first drum and for separating the at least part of the device chips from the first substrate by rotating the first drum, and an inversion step for making the device chips on the selective adhesive region of the first drum come into contact with and adhere to a fourth adhesive layer of a second drum and for separating the device chips from the selective adhesive region by rotating the first drum and the second drum oppositely to each other, and a second transfer step for making the device chips come into contact with and adhere to the second adhesive layer of the second substrate and for separating the device chips from the second drum by rotating the second drum.

In the embodiment of the present invention, an adhesion force between the first adhesive layer and the device chips may be weaker than an adhesion force between the selective adhesive region and the device chips, the adhesion force between the selective adhesive region and the device chips may be weaker than an adhesion force between the fourth adhesive layer and the device chips, and the adhesion force between the fourth adhesive layer and the device chips may be weaker than an adhesion force between the second adhesive layer and the device chips.

In the embodiment of the present invention, the method of manufacturing electronic devices may include the preparation step for preparing the first substrate having the first adhesive layer and the second substrate having the second adhesive layer, the first adhesive layer including the surface where the plurality of device chips are adhered, the first take-out step and the first transfer step, and the first take-out step, the inversion step, and the second transfer step.

The transferring of the device chips using the first and second drums enables the front and rear surfaces of each device chip to be inverted between the first and second substrates, and also enables the front and rear surfaces of each device chip to be properly and at least selectively combined depending on connections of the device chips with other circuit or element, etc. for the product to be manufactured.

Additionally, the front and rear surfaces of each device chip may be inverted collectively and it may minimize an added time caused by the tact time for inverting.

In the embodiments of the present invention, the method of manufacturing electronic devices may further include the first take-out step and a parallel-move step for separating the first drum from the first substrate after the first take-out step and for moving the first substrate in a direction parallel to a rotation shaft of the first drum.

The first take-out step and the parallel-move step are repeated several times, so as to transfer the device chips to the selective adhesive region of the first drum.

The device chips may be transferred by repeating the first take-out step and the parallel-move step and it may enable the device chips to be transferred to the intended location on the second substrate, even if the area of the second substrate is larger than the area of the first substrate. Consequently, it may shorten the tact time for arranging the device chips and may also reduce the manufacturing cost.

In the embodiments of the present invention, the selective adhesive region may include convex portions.

The selective adhesive region of the first drum may include the convex portions, which are formed so to project from the surrounding adhesive layer, so that the device chips are selectively adhered to the predetermined area of the first drum. Additionally, the arrangement of the convex portions on the adhesive layer of the first drum may be properly adjusted according to type of the electronic device, and it may enable the intended number of the device chips to be adhered to the intended area with intended positional accuracy.

According to one embodiment of the present invention, an apparatus for manufacturing electronic devices includes a traveling guide, a first conveying table, a second conveying table, and a first drum.

The first conveying table include a first traveling device that makes the first conveying table move on the traveling guide and a traversing device that moves perpendicularly to the longitudinal direction, the second conveying table includes a second traveling device that makes the second conveying table move on the traveling guide, and the first drum includes a first rotation shaft, a first elevating device for raising and lowering the first drum, a first rotation device for rotating the first drum around the first rotation shaft, and a mechanism for controlling a tilt angle in the longitudinal and/or vertical directions of the first rotation shaft of the first drum against the first conveying table, and further includes a third adhesive layer having a selective adhesive region.

In such an above configuration, the elevating device lowers the first drum until the selective adhesive region of the first drum comes into contact with the device chips on the first adhesive layer of the first substrate placed on the first conveying table, the selective adhesive region is brought into contact with the first substrate surface, and the first conveying table is moved while the first drum is being rotated, the adhesion force of the selective adhesive region and the rotary motion caused by the first rotation device allow the device chips to be taken-out from the first substrate by making the device chips at least selectively adhere to the selective adhesive region and by separating the device chips from the first substrate, subsequently, the first drum is raised, the second conveying table is moved below the first drum, and the first elevating device of the first drum lowers the first drum, the device chips on the selective adhesive region are brought into contact with the second adhesive layer of the second substrate on the second conveying table, and the taken-out device chips on the selective adhesive region can be sequentially transferred to the second substrate by moving the second conveying table while the first drum is being rotated.

Consequently, compared with the case using a flat relay substrate, the shape of the drum allows the device chips to be brought into line-contact, not surface-contact, with the drum, and leads the reduced pushing length. Accordingly, the uniform weak force allows the device chips to be separated from the first substrate and to be transferred to the second substrate that is a substrate for the product, and thus, the arrangement accuracy for the device chips may be improved, the tact time for transferring the device chips may be shortened, and the manufacturing cost may be reduced.

Furthermore, the first conveying table has the traversing device, which allows the followings to be repeated:

after the device chips on the first substrate are made to be adhered to the selective adhesive region of the third adhesive layer of the first drum, the first drum is separated from the first substrate;

the first conveying table is moved using the traversing device; and the device chips remaining on the first substrate are made to be selectively adhered to the selective adhesive region of the first drum where the device chips are not adhered.

This allows the intended device chips to be transferred from the selective adhesive region of the first drum to the second substrate.

Consequently, even if the second substrate area is larger than the first substrate area, the device chips can be transferred from the first drum to the second substrate in a lump and the tact time for manufacturing the electronic devices may be also shortened.

In the embodiment of the present invention, the apparatus for manufacturing electronic devices may further include a second drum.

The second drum may include a second rotation shaft, a second elevating device for raising and lowering the second drum, a second rotation device for rotating the second drum around the second rotation shaft.

At least one of the first drum and the second drum may have a drum mover that moves in a direction parallel to a longitudinal direction of the traveling guide.

The first drum may include the third adhesive layer having the selective adhesive region.

The second drum may include a fourth adhesive layer, and an adhesion force of the selective adhesive region may be weaker than an adhesion force of the fourth adhesive layer.

In such above configuration, the device chips on the first adhesive layer of the first substrate placed on the first conveying table is made to be at least selectively adhered to the selective adhesive region of the third adhesive layer of the first drum, the device chips are taken-out by moving the first conveying table while the first drum is being rotated, subsequently, the first drum or the second drum is moved using the drum mover, the device chips adhered to the selective adhesive region of the third adhesive layer of the first drum are brought into contact with the fourth adhesive layer of the second drum, and the device chips are transferred from the selective adhesive region of the first drum to the fourth adhesive layer of the second drum by rotating the first and second drums oppositely to each other.

In the above, since the adhesion force of the selective adhesive region is weaker than the adhesion force of the fourth adhesive layer, the device chips may be surely transferred.

Subsequently, the first and second drums are separated each other, the second drum is positioned on the second substrate placed on the second conveying table using the drum mover or using the second traveling device of the second conveying table, the second elevating device lowers the second drum until the device chips on the fourth adhesive layer of the second drum comes into contact with the second adhesive layer of the second substrate, the device chips on the fourth adhesive layer may be transferred to the second substrate by moving the second conveying table while the second drum is being rotated.

Consequently, the front and rear surfaces of each device chip can be inverted and the device chips may be surely transferred to the second substrate, and thus, the arrangement accuracy for the device chips may be improved and the tact time for transferring may also be shortened.

Additionally, since the first conveying table has the traversing device, it allows the following step to be repeated:

after the device chips on the first substrate are made to be adhered to the selective adhesive region of the third adhesive layer of the first drum, the first drum is separated from the first substrate;

the first conveying table is moved using the traversing device; and the device chips remaining on the first substrate are made to be selectively adhered to the selective adhesive region of the first drum where the device chips are not adhered.

This allows the intended device chips to be transferred from the selective adhesive region of the first drum to the second substrate.

Consequently, even if the second substrate area is larger than the first substrate area, the device chips may be transferred to the second substrate in a lump while front and rear surfaces of each device chip are inverted between the first drum and the second drum, and the tact time for manufacturing the electronic devices may be shortened.

In the embodiments of the present invention, the selective adhesive region may include convex portions.

The selective adhesive region of the first drum includes the convex portions, which are formed so to project from the surrounding adhesive layer. This configuration allows the device chips to be selectively adhered to the predetermined area of the first drum. Additionally, the arrangement of the convex portions on the adhesive layer of the first drum are properly adjusted according to type of the electronic device, and it enables the intended number of the device chips to be adhered to the intended area with intended positional accuracy.

The method and apparatus according to the embodiments of the present invention are used for transferring a variety of electronic device chips, but not limited to light emitting elements, such as LEDs, to place them in alignment on a substrate. Examples of the electronic device chips may include: a micro device chip, such as a light receiving element, a piezo element, an acceleration sensor, NEMS, and MEMS; a memory element according to a charge storage system, or other systems, such as MRAM, FeRAM, and PCM; a switching element; and an operation processing device chip, such as a microcomputer.

Additionally, since the method according to the embodiments of the present invention does not include any heating process, a flexible substrate or a substrate having relatively low heat resistance (equal to or less than 80° C.) may be also effectively used as a substrate used for transferring the device chips.

Furthermore, the electronic device manufactured using the method according the embodiments of the present invention may be a part or the whole of the product (final product) or may be a part or the whole of the intermediate product (object) or by-product.

Effects of the Invention

According to the embodiments of the present invention, the device chips are selectively taken-out by making the selective adhesive region (convex portions) formed on the third adhesive layer of the first drum to come to line-contact with the device chips, and thus, pushing length (printing effect) during contacting can be reduced. Consequently, deterioration of positional accuracy, which is caused by an elastic deformation or the like in the convex portions of the adhesive layer having elasticity, can be suppressed.

Additionally, the use of the first drum or the first and second drums allows the device chips to be transferred from the first substrate to the second substrate in a lump, and thus, the tact time for manufacturing the electronic devices may be shortened.

Furthermore, since the device chips can be at least selectively taken-out and can be placed on the position which is conformable with the final product, the device chips can be more freely arranged.

BRIEF DESCRIPTION OF THE DRAWINGS

FIGS. 4A, 4B, 4C, and 4D are development diagrams illustrating arrangement examples of convex portions on a first drum;

FIG. 5 is a cross-sectional view of the apparatus in an operation state according to the first embodiment of the present invention;

FIG. 6 is the other cross-sectional view of the apparatus in an operation state according to the first embodiment of the present invention;

FIGS. 10A, 10B, and 10C are plan views of a transfer process of device chips on the first substrate.

MODE FOR CARRYING OUT THE INVENTION

First Embodiment

Figure 1:
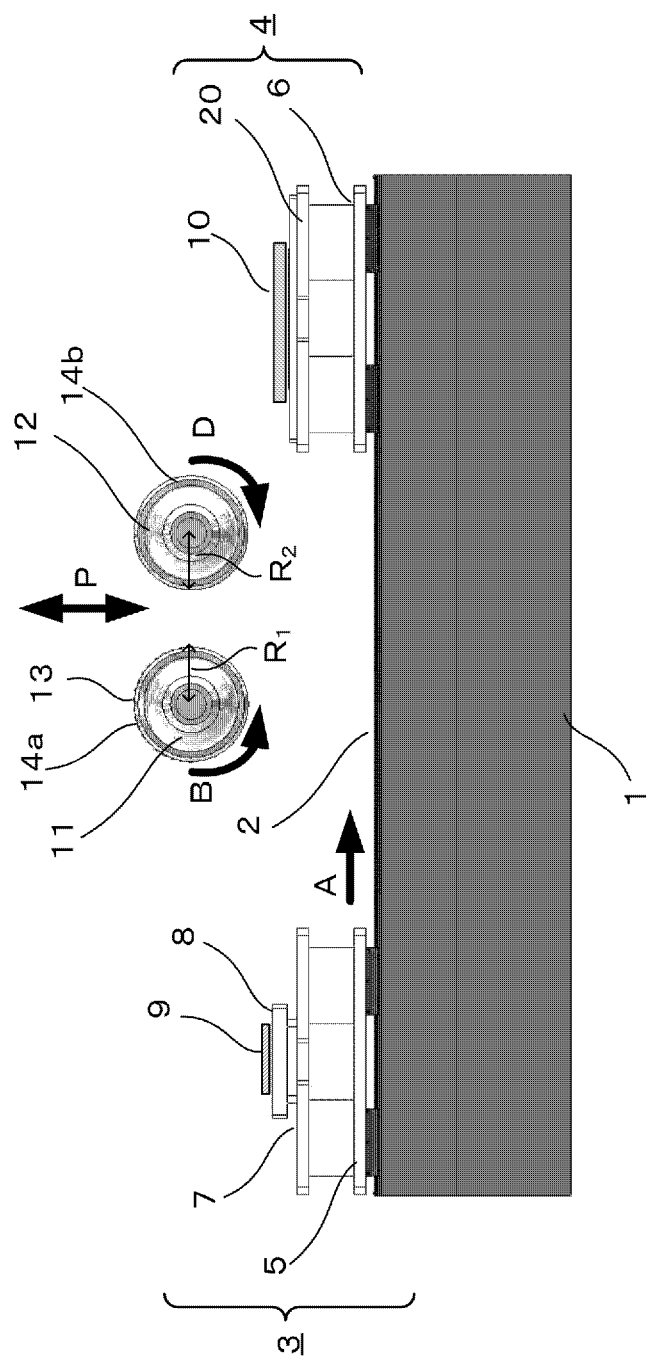
FIG. 1 is a cross-sectional view of an apparatus for manufacturing electronic devices according to a first embodiment of the present invention.

A first embodiment will be described below.
[Apparatus Configuration]
FIG. 1 is a cross-sectional view of an apparatus for manufacturing electronic devices according to the first embodiment of the present invention.

A traveling guide 2 formed by a plurality of parallel rails, etc. is placed on an apparatus base 1. Further, a first conveying table 3 and a second conveying table 4 are mounted on the traveling guide 2, and the first conveying table can be moved using a first traveling device 5 and the second conveying table 4 can be move using a second traveling device 6 along the traveling guide 2.

The first conveying table 3 includes an alignment device 7 on the first traveling device 5 and further includes a traversing device 8 on the alignment device 7. The traversing device 8, the alignment device 7, and the first traveling device 5 move along with the movement of the first conveying table 3.

Figure 2:
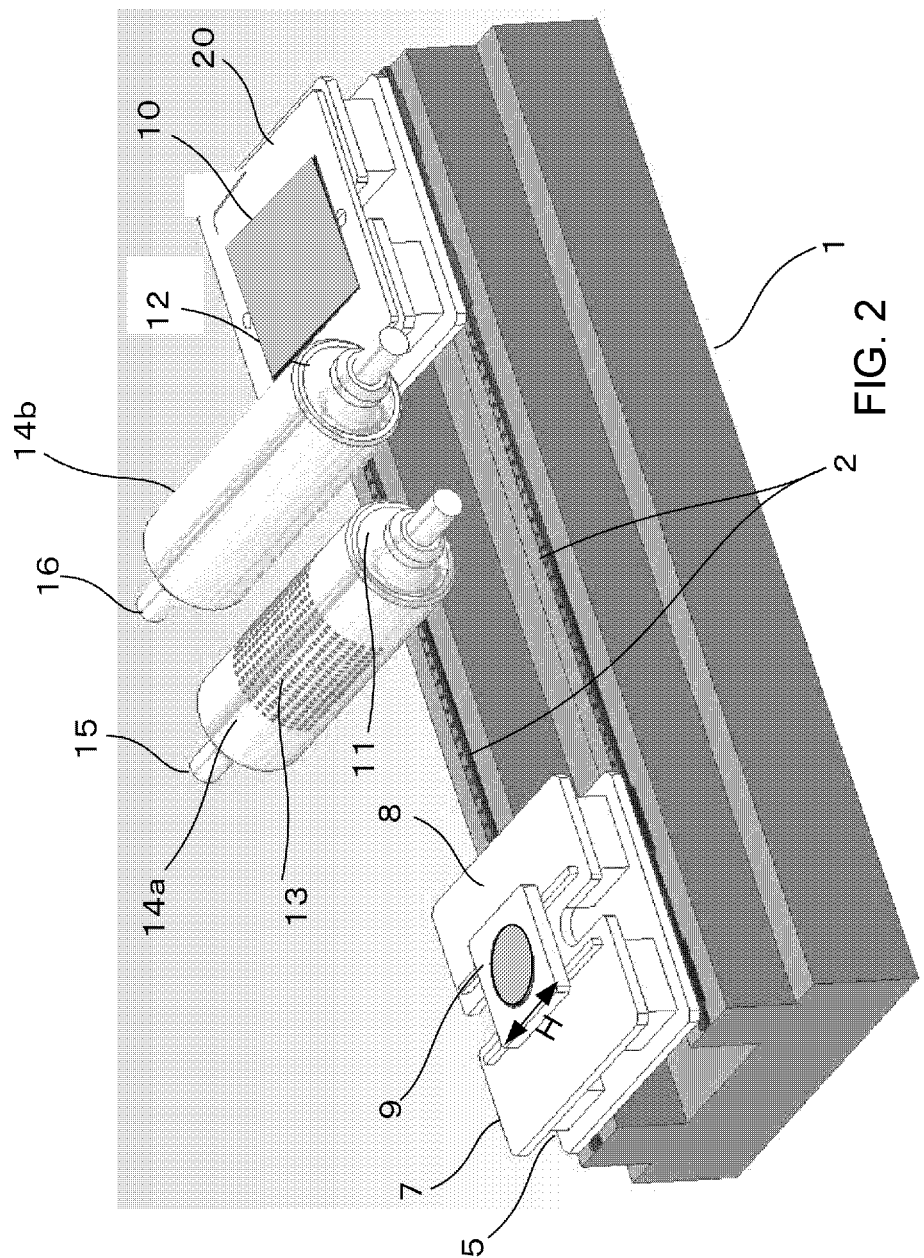
FIG. 2 is a perspective view of the apparatus for manufacturing electronic devices according to the first embodiment of the present invention.

The traversing device 8 enables a first substrate 9 to move in longitudinal and vertical directions of the traveling guide 2 (H-direction shown in FIG. 2). The traversing device 8 further includes a first substrate supporting stand (not shown) where the first substrate 9 may be mounted and held. The first substrate 9 includes a first adhesive layer where a plurality of electronic device chips (hereinafter referred as to "device chips") 17 are adhered.

A use of the first substrate supporting stand prevents the positions of the first substrate 9 from being displaced on the traversing device 8 when the first conveying table 3 is moved along the traveling guide 2 or moved using the traversing device 8. Side faces or an upper face of the first substrate 9 may be mechanically pressed and held using the first substrate supporting stand, or a back face of the first substrate 9 is sucked using the first substrate supporting stand and the first substrate 9 may be hold by the suction, but it is not limited to. Any device that can fix the position of the first substrate 9 may be used. A method for holding the first substrate 9 may be selected according to the shape or behavior of the first substrate 9.

Examples of the device chip 17 may include: light emitting element, such as LED: a micro device chip, such as a light receiving element, a piezo element, an acceleration sensor, NEMS, and MEMS; a memory element according to a charge storage system or other systems, such as MRAM, FeRAM, and PCM; a switching element; and an operation processing device chip, such as a microcomputer, but not limited to.

The first substrate 9 includes the first adhesive layer and is formed by a flat substrate where a plurality of device chips are adhered. The flat substrate is manufactured using a silicon wafer, a composite semiconductor wafer, a glass substrate, a substrate made of metallic oxide, such as sapphire, or the like, is often circular, and has from 4 to 8 inches in diameter, but not limited to it. The first substrate 9 itself may also be an adhesive substrate and may double as the first adhesive layer. These device chips 17 are object to be transferred.

The alignment device 7 includes a mechanism for moving parallel to a longitudinal direction of the traveling guide 2 and the other mechanism for rotating around a rotation shaft in a vertical direction that is perpendicular to the longitudinal direction (parallel to P-direction). A use of the alignment device 7 also enables positions of the first substrate 9 (reference position of the first substrate 9) to be recognized using optical means, etc. and enables the first substrate 9 to be mounted (aligned) on a predetermined position with an accuracy at a spatial resolution of 0.1 µm and over a maximal moving distance of several millimeters (e.g. 3 to 5 mm).

In addition to it, the above rotational mechanism also enables the angles to be adjusted to the longitudinal direction of the traveling guide 2 or a longitudinal direction of a first rotation shaft 15 of a first drum (will be described below).

The second conveying table 4 includes an alignment device 20 on the second traveling device 6. The alignment device 20 includes a second substrate supporting stand (not shown), and a second substrate 10 (work), which the device chips 17 are to be transferred to, can be mounted on the second substrate supporting stand.

A use of the second substrate supporting stand prevents the positions of the second substrate 10 from being displaced when the second conveying table 4 is moved in a longitudinal direction of the traveling guide 2. The second substrate 10 includes a second adhesive layer, which is formed in portions where the device chips 17 are to be transferred.

The second substrate 10 may be not only a hard substrate made of glass or the like, but also a flexible substrate or the other substrate having a low resistance to some process using heat, chemical, plasma, or the other treatment.

The alignment device 20 mounted on the second conveying table 4 provides the same alignment precision as that of the alignment device 7.

The second substrate supporting stand may be a device to mechanically press and hold side faces or an upper face of the second substrate 10 or may be the other device to suck a back face of the second substrate 10, but it is not limited to. Any device that can fix the position of the second substrate 10 may be used. A method for holding the second substrate 10 may be selected according to the shape or behavior of the second substrate 10.

The second substrate 10 is a substrate for a display screen when the device chips 17 are LEDs, and the second substrate 10 is often larger than the first substrate 9 as enlarged display screens are often manufactured. The second substrate 10 is also not limited to a substrate for a display screen, and the second substrate 10 is an object where the device chips 17 are mounted, and becomes a different substrate depending on the type of an electronic device to be manufactured or the type of the device chips.

As shown in FIG. 1, a first drum 11 (take-out barrel drum) and a second drum 12 (inversion barrel drum), which are circular cylindrical, are positioned above the first conveying table 3 and the second conveying table 4.

The first drum 11 is cylindrical, and has a rotation shaft 15 perpendicular to a longitudinal direction of the traveling guide 2 as shown in FIG. 2 and a rotation device (not shown) for rotating the first drum 11 around the rotation shaft 15. The rotation shaft 15 has lifting and lowering devices (not shown) at its both ends for moving the first drum 11 in P-direction in FIG. 1. The tilt of the rotation shaft 15 is controlled by independently driving each lifting and lowering device in a vertical direction and thus can be adjusted so as to be parallel to a surface of the first substrate 9.

Additionally, a supporting shaft vertically extending is provided at one end of the rotation shaft 15 of the first drum 11, and the first drum 11 includes a mechanism for vertically moving the first drum 11 along the supporting shaft and for rotating the first drum 11 around the other end of the rotation shaft 15. The other end is positioned in horizontally to the one end of the rotation shaft 15 at the supporting shaft. The mechanism allows an intersection angle (tilt) between the longitudinal direction of the traveling guide 2 and the rotation shaft 15 to be adjusted, and it may be adjusted manually or using a linear motion mechanism.

The second drum 12 is cylindrical, and has a rotation shaft 16 perpendicular to a longitudinal direction of the traveling guide 2 as shown in FIG. 2 and a rotation device (not shown) for rotating the second drum 12 around the rotation shaft 16. The rotation shaft 16 has lifting and lowering devices (not shown) at its both ends for moving the second drum 12 in P-direction in FIG. 1. The tilt of the rotation shaft 16 is controlled by independently driving each lifting and lowering device in a vertical direction and thus can be adjusted so as to be parallel to a surface of the second substrate 10. In addition to the lifting and lowering device, a drum mover (not shown) for moving back and forth the second drum 12 parallel to the longitudinal direction of the traveling guide 2 is also provided.

Each rotation around the rotation shaft 15 of the first drum 11 and around the rotation shaft 16 of the second drum 12 is driven using a combination of a direct drive motor and a rotation position detection encoder, and the rotational angle is also detected using the combination. The direct drive motor is directly connected to each rotation shaft 15 and 16, and the rotation position detection encoder has a higher resolution precision than a predetermined resolution precision.

As shown in FIG. 2, the rotation shaft 16 of the second drum 12 is positioned so as to be parallel to the rotation shaft 15 of the first drum 11.

In one example, each diameter of the first drum 11 and the second drum 12 being 100 to 500 mm is suitable to use in the viewpoint of machining accuracy, but not limited to the range.

A radius $R_1$ perpendicular to the rotation shaft 15 of the first drum 11 and the other radius $R_2$ perpendicular to the rotation shaft 16 of the second drum 12 may be different each other. When the first and second drums having the same radius are brought into contact each other, the uniformity of the pressure of the contact area is easily assured.

Figure 3:
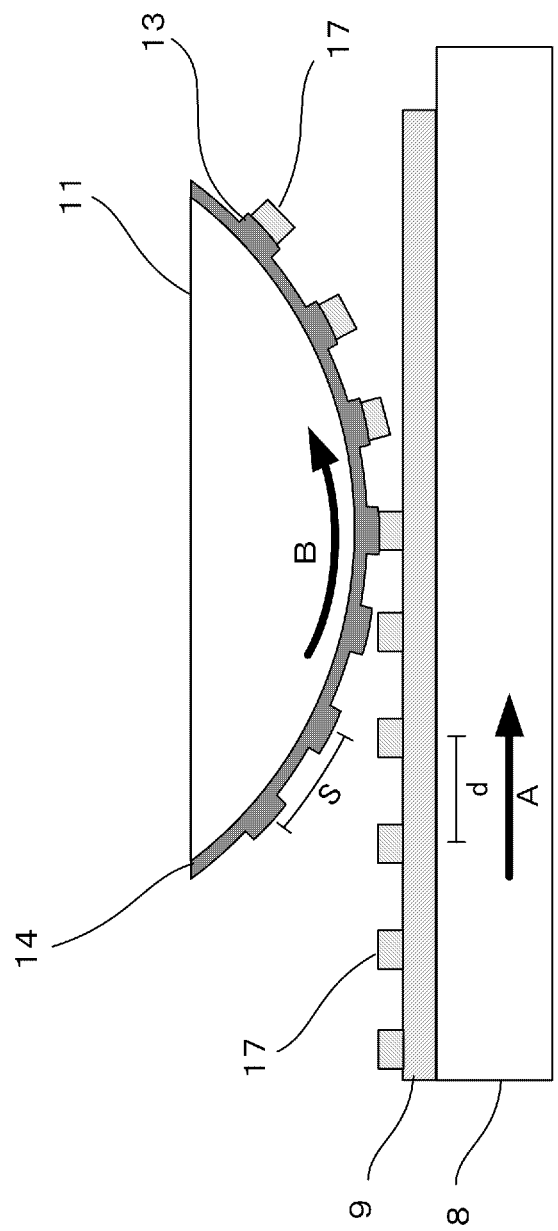
FIG. 3 is an enlarged view of a part of the apparatus for manufacturing electronic devices where a first drum and a first substrate are in contact with each other according to the first embodiment of the present invention.

As shown in FIGS. 2 and 3, a third adhesive layer 14a having a selective adhesive region, and more particularly, convex portions 13, is provided on a surface of the first drum 11, and the third adhesive layer 14a is made of silicone rubber or the like. A fourth adhesive layer 14b is provided also on a surface of the second drum 12, and the fourth adhesive layer 14b is made of silicone rubber or the like. The first and second adhesive layers may be made of the same type of resin.

The radius $R_1$ is a distance from the center of the rotation shaft 15 to the convex portions 13, and the radius $R_2$ is a distance from the center of the rotation shaft 16 to a surface of the fourth adhesive layer 14b. When the device chips 17 are adhered to the convex portions 13 or the fourth adhesive layer 14b, the above distance ($R_1$ or $R_2$) is a distance from the center of the rotation shaft 15 or 16 to surfaces of the device chips 17, that is, one surface side of the device chips 17 where the adhesive layer is not contacted. In more detail, pushing length is given when these drums are contacted, and thus, a basic definition for a radius:

radius $R_1$=(distance from the center of the first drum to the convex portions or the surfaces of the device chips)−(pushing length or its one-half); and radius $R_2$=(distance from the center of the second drum to the convex portions or the surfaces of the device chips)−(pushing length or its one-half)

wherein "pushing length" is selected for a hard surface (high hardness) and "its one-half" is selected for an elastic body.

With a material for the convex portions of the first drum having hardness differences, deformation quantity is increased at the more elastic portion. When the device chips are adhered and separated using the drum, and more particularly, at the moment that the elastic deformation of the drum is recovered when the separating is finished, a rotational speed of the drum (peripheral speed or angular speed) gets fast and it may cause displacement at the same time.

The pushing length (printing effect) requires to be controlled for suppressing the above variations. In one example, if the device chips are arranged sparsely or densely by location, the printing effect is varied and it causes the positional accuracy for transferring to be deteriorated, and thus, the rotational speed of the drum (peripheral speed or angular speed) requires to be controlled.

The convex portions 13 of the third adhesive layer 14a can be formed by separately preparing a plate (e.g. made of metal) with concave portions corresponding to the convex portions 13, by pouring a photo-curable resin or a thermosetting resins onto the concavity plate, and by curing it. The photo-curable resin may be used for making the third adhesive layer 14a, and a lithography method may be also utilized. In one example, a thickness of the adhesive layer 14a may be 5 to 500 μm, each thickness of the convex portions 13 depends on the sizes of convex portions 13/the strength of the adhesive layer, and the convex portions 13 project from the other portion of the third adhesive layer 14a, for example, by 5 to 250 μm, but not limited to.

Instead of configuring the selective adhesive region including the convex portions 13 as described above, the selective adhesive region may be made to have an adhesion force stronger than that of the other portion on the third adhesive layer 14a.

In one example, the third adhesive layer 14a may be planarly formed using some resins having adhesive properties, such as an ultraviolet-curable resin, and the resins in the third adhesive layer 14a other than the selective adhesive region corresponding to the arrangement position of the device chips 17 that are subject to be taken-out may be cured by irradiation with ultraviolet rays, so as to decrease the adhesive force while the hardness of the resins are enhanced. For the above, "distance from the center of the first drum to the convex portions or the surfaces of the device chips" in a formula for computation of the radius $R_1$ is changed into "distance from the center of the first drum to the third adhesive layer 14a or the surfaces of the device chips."

For a method for selectively irradiating ultraviolet rays, an exposure processing using a mask having an irradiation region for selectively transmitting or shielding ultraviolet rays may be employed, or ultraviolet rays may be directly drawn. Thus, is it possible to produce a selective adhesive region without producing the concavity plate.

Material of the adhesive layer may be an ultraviolet-curable resin or a thermosetting resin. The resin for forming the third adhesive layer 14a are not limited to the above, and the composition or the method is also not limited at all if the adhesive force of the resin in the area other than the selective adhesive region can be decreased according to the arrangement of the device chips 17. In this regard, the adhesive force of between the device chips 17 and the area other than the selective adhesive region on the first adhesive layer is set to be weaker than the adhesive force between the device chips 17 and the selective adhesive region on the first adhesive layer.

Lifting and lowering devices allow the first drum 11 to be lowered until the convex portions 13 on the third adhesive layer 14a of the first drum 11 comes into contact with the device chips 17 on the first substrate 9, and the other lifting and lowering devices allow the second drum 12 to be lowered until the fourth adhesive layer 14b of the second drum 12 comes into contact with the adhesive layer of the second substrate 10. More precisely, the drum 2 is lowered until the device chips 17 adhered to the fourth adhesive layer 14b of the second drum come into contact with the adhesive layer of the second substrate 10.

A resin having adhesive properties may be used for the third adhesive layer 14a and also for the fourth adhesive layer 14b, and each thickness is 5 to 500 μm in one example.

The first and second drums are lifted and lowed from a fiducial position where outer peripheries of the first and second drums are parallel to the surfaces of the first and second conveying tables. The centers of the rotation shafts of the first and second drums are assured to be orthogonal relative to a traveling axis of the traveling guide by means of fiducial adjustment.

The alignment device 7 can detect a fiducial position of the first drum 11 and can align the first substrate 9 and the first drum 11. The alignment device 20 can detect a fiducial position of the second drum 12 and can align the second substrate 10 and the second drum 12. As described above, the alignment can be performed with an accuracy at a spatial resolution of 0.1 µm and over a maximal moving distance of several millimeters.

The convex portions 13 formed on the first drum 11 can be recognized using an optical apparatus, and the alignment device 7 of the first conveying table 3 aligns the positions of the convex portions 13 and the positions of each device chips on the first substrate 9. When the current plate-like relay substrate is used, the device chips require to be aligned on the flat surface of the plate-like relay substrate. However, a use of the relay substrate according to the embodiments of the present invention has only aligning the device chips substantially on a straight line and can also decrease applied pressures, and thus, it leads a deformation to be reduced and an alignment precision to be improved.

The convex portions 13 are formed according to an arrangement pattern on the first substrate 9 for the device chips. In one example, when the device chips are placed on the lattice points with a constant pitch, the convex portions 13 are formed on a surface of the first drum 11 with the same pitch as the constant pitch on the first substrate or with integral multiples of the constant pitch.

As shown in FIG. 4A, the pitch is not necessarily constant, and the arrangement pattern of the convex portions 13 can be determined so as to select the device chips 17 to be taken-out (picked up) according to the arrangement for transferring to the second substrate 10.

Each of FIGS. 4A to 4D is diagram where the adhesive layer of the first drum 11 is developed, wherein the X-direction in FIGS. 4A to 4D is parallel to the rotation shaft 15 of the first drum and Y-direction is vertical to the direction parallel to the rotation shaft 15 and is along a circumference of the first drum 11.

The first conveying table 3 is moved in A-direction of one arrow in FIG. 1 on the traveling guide 2 by the first traveling device 5 while keeping a horizontal level of the surface on the first substrate supporting stand.

The first substrate 9 an the first conveying table 3 move at the same speed. The first drum 11 is synchronized with the first traveling device 5, and can be rotated in B-direction of the other arrow in FIG. 1 by the rotation device while keeping its position.

The rotation device of the first drum 11 and the first traveling device 15 independently run and do not interfere with each behavior. This makes easy to accurately keep a length between the first conveying table 3 and the first drum 11 in a vertical direction (the shortest distance between the rotation shaft 15 and the surface of the first substrate 9) constant.

[Transfer Process of Device Chips]

A method for manufacturing electronic devices using the above apparatus for manufacturing electronic devices by transferring device chips from the first substrate 9 to the second substrate 10 will be described below.

First, the first substrate includes the first adhesive layer, and the first adhesive layer where the plurality of device chips 17 are adhered is mounted on the first substrate supporting stand of the first conveying table 3. After the first substrate 9 and the first drum 11 are aligned using the alignment device 7, the first drum 11 is positioned above the first substrate 9.

Second, the first drum 11 is lowered, and the device chips 17 on the first substrate 9 and convex portions 13 of the third adhesive layer 14a are brought into contact.

However, the convex portions 13 does not necessarily come into contact with the device chips 17 when the first drum 11 is lowered, and then, the convex portions 13 may come into contact with the device chips 17 by rotating the first drum and moving the first substrate as described below.

FIG. 3 is an enlarged view of a part where the first drum 11 and the first substrate 9 are in contact with each other. The convex portions 13 comes into contact with and adheres to the device chips 17 on an adhesive layer (not shown) of the first substrate 9.

The first conveying table 3 is moved in A-direction and the first drum 11 is rotated in B-direction. This allows the device chips 17 to be separated from the first substrate 9 and to be transferred to the first drum 11.

The rotating motion of the first drum 11 allows bringing the convex portions 13 into contact with the device chips 17 on the first substrate 9 and separating the device chips 17 from the first substrate 9 to be sequentially performed.

When the first drum 11 is rotated, a force directing obliquely upward by the adhesive force of the convex portions 13 is applied on the device chips 17 and the device chips 17 are separated from the surface of the first substrate 9. Then, the device chips 17 separated from the surface of the first substrate 9 are transferred to the convex portions 13 formed in the third adhesive layer 14a on the surface of the first drum 11.

As described above, each device chip 17 is picked up sequentially from an end surface of the first substrate 9 during a separating process, and thus, a force for separating each device chip 17 can be reduced and it also leads to stably transferring the device chips 17 to the first drum 11.

Although the convex portions 13 come into contact with the device chips 17 on a flat surface when the conventional plate-like relay substrate is used, the apparatus using the relay substrate according to the embodiments of the present invention allows the convex portions 13 to come into contact with the device chips 17 on a straight line parallel to the rotation shaft of the first drum 11. Consequently, a use of the relay substrate according to the embodiments of the present invention allows less contact area between the convex portions 13 and the device chips 17, allows applied pressures from the first drum 11 on the first substrate 9 to be decreased, and also allows the uniformity of the pressure on the contact area to be improved, compared with the conventional plate-like relay substrate.

Furthermore, deformation over the adhesive layer 14a having the convex portions 13 due to the pressure can be suppressed, and misalignment of the device chips 17 on the convex portions 13 can be reduced.

This effect occurs not only for the above, but also when the second drum 12 is pressed against the second adhesive layer of the second substrate 10 as will be described below, and the misalignment of the device chips 17 on the second substrate 10 can also be suppressed.

In order to enable the device chips 17 to be transferred from the first substrate 9 to the first drum 11, it is advantageous for the adhesive force between the convex portions 13 of the first drum 11 and the device chips 17 to be stronger than that between the first adhesive layer of the first substrate 9 and the device chips 17.

For a method for adhering the device chips 17 to the first adhesive layer of the first substrate 9, when LEDs are manufactured on a wafer in one example, known mounting techniques may be utilized: the wafer (semiconductor substrate) stuck on a dicing frame and diced may be utilized. (e.g. see JP 2003-318205 A1)

In this case, the dicing frame corresponds to the first substrate 9, a resin-made sheet of the dicing frame corresponds to the first adhesive layer, and chips of the diced wafer respectively correspond the device chips 17. Although commercial sheets whose adhesive force is known can be used for the resin-made sheet of the dicing frame, an adhesive layer whose adhesive force is adjusted may be formed on the resin-made sheet. It allows the adhesive force between the adhesive layer of the first substrate 9 and the device chips 17 to be adjusted.

The above is a mere example, and examples of the device chips 17 are not limited to the above and also include device chips other than LEDs. A method allowing the adhesive force to be provided according to kinds of the device chips and its manufacturing method is used, and thus, the first adhesive layer of the first substrate 9 can be adhered to the device chips 17.

Rotational speed (angular speed) of the first drum 11 is adjusted so that each convex portion 13 of the first drum 11 respectively comes into contact with each device chip 17 of the first substrate as shown in FIG. 3.

In one example, "S" is given to a pitch of each convex portion 13, and "d" is given to a pitch of each device chip 17 of the first substrate 9. When the pitch of each convex portion 13 is equal to that of each device chip 17, a speed of the first conveying table 3 in A-direction of an arrow in FIG. is "$V_A$", and an angular speed of the first drum 11 is "$\omega$", the first drum 11 may be rotated at the angular speed where $\omega=\omega_0=V_A/R_1$: wherein $R_1$ is the radius of the first drum 11 as described above. Although FIG. 3 shows one example where the pitches "S" and "d" are constant, that is, evenly spaced, the above relational expression depends on neither "S" nor "d". The above relational expression is fulfilled even if the pitches are not evenly spaced, and the pitches are not necessarily evenly spaced.

Additionally, the pitch "S" of each convex portion 13 and the pitch "d" of each device chip 17 of the first substrate 9 can also be relatively changed by changing the angular speed "$\omega$" from the above $\omega_0$.

For example, when the angular speed "$\omega$" of is changed into $\omega_1$ different from $\omega_0$, it takes $d/V_A$ to move the first substrate 9 by the pitch "d" and thus for the pitch "S" of each convex portion 13, $S=R_1\omega_1(d/V_A)$ is fulfilled. Accordingly, $S/d=R_1(\omega_1/V_A)$, and the ratio of the pitch "S" to the pitch "d" is proportional to the angular speed "$\omega_1$" of the first drum 11 and the moving speed "$V_A$" of the first conveying table 3. Consequently, the pitch "S" of each convex portion 13 and the pitch "d" of each device chip 17 of the first substrate 9 can be made different each other by changing the angular speed, and the difference between "S" and "d" may be varied by, for example, several tens of μm. The moving speed $V_A$ may also be changed to the contrary.

When the ratio of the angular speed "$\omega_1$" of the first drum 11 to the moving speed "$V_A$" of the first conveying table 3 is made to be constant, the ratio of the pitches can be changed in the single uniform way. When the pitch "S" and/or the pitch "d" are not constant, the information about the position dependency is stored in a memory or the like. The angular speed or the moving speed is then set according to the information, and the pitch "S" of each convex portion 13 may also be optionally changed relative to the pitch "d" of each device chip 17 of the first substrate 9.

FIG. 4B is one example where the arrangement of each convex portion 13 in FIG. 4A is changed. The arrangement can be changed in Y-axis direction from that in FIG. 4A to that in FIG. 4B without changing the arrangement of the device chips 17 on the first substrate 9 by adjusting the angular speed.

The first substrate 9 is moved in A-direction and perpendicular to the A-direction while the first drum 11 is being rotated, and the moving allows the arrangement of each convex portion 13 to be changed not only in A-direction but also perpendicular to the A-direction.

FIG. 4C is one example showing the above arrangement of each convex portion 13, and the arrangement is displaced (changed) in X-axis direction. Each device chip 17 can be transferred to each convex portion 13 whose arrangement is displaced (changed) without changing the arrangement of the device chips 17 on the first substrate 9 by moving the first substrate 9 perpendicular to the A-direction. In this case, as shown in FIG. 4C, the pitches are not changed perpendicular to the A-direction of the convex portions 13, but the position of each convex portion 13 is shifted in parallel.

The arrangement of each convex portion 13 is also displaced in both of X-axis and Y-axis directions in FIG. 4D, but the device chips 17 can be transferred on the convex portions 13 without changing the arrangement of each device chip 17 on the first substrate 9 by moving the first substrate 9 in A-direction and perpendicular to the A-direction and by adjusting the angular speed of the first drum 11.

As described above, the arrangement of each convex portion 13 is changed from that in FIG. 4A to those in FIGS. 4B, 4C, and 4D without changing the arrangement of each device chip 17 on the first substrate 9, and the device chips 17 whose arrangement is equal to that of the convex portions 13 can be selected and adhered. Consequently, the arrangement of the device chips 17 on the second substrate can be changed as described below. This allows a variety of electronic devices to be manufactured. The variety of electronic devices cannot be manufactured without changing the arrangement of the device chips 17 on the first substrate 9 by using the conventional method using a flat relay substrate.

After the device chips 17 are transferred onto the convex portions 13 of the first drum 11, as shown in FIG. 5, the first drum 11 is raised and the second drum 12 is then moved in a direction opposite to A-direction (C-direction) until the second drum 12 comes into contact with the first drum 11. Subsequently, the first drum 11 and the second drum 12 are rotated in the opposite directions each other (B-direction and D-direction). FIG. 5 shows that the first substrate 9 is not moved after the device chips 17 are transferred from the first drum 11. However, the first substrate 9 may be moved in a direction opposite to A-direction and returned to the original position (see FIG. 1).

Each angular speed of the first drum 11 and the second drum 12 is determined so that each speed in a tangent line direction of each radius is the same at the contact position of the first drum 11 and the second drum 12. When "$\omega_B$" is given to an angle around the rotation shaft 15 of the first drum 11 and "$\omega_C$" is given to an angle around the rotation shaft 16 of the second drum 12, each rotational direction is opposite each other and thus each angular speed is set so as to fulfill $\omega_B=-\omega_C(R_2/R_1)$.

The applied forces on the first drum 11 and the second drum 12 are even at the position where the first drum 11 comes into contact with the second drum 12, and thus, the above radius $R_1$ and radius $R_2$ are preferably set to the same value and $\omega_DB=-\omega_C$ is fulfilled.

The fourth adhesive layer 14b of the second drum 12 includes resin having a stronger adhesive force than the adhesive layer 14a of the first drum 11 includes. The stronger adhesive force allows the device chips 17 of the first drum 11 to be separated from the convex portions 13 included in the adhesive layer 14a of the first drum and to be transferred to the fourth adhesive layer 14b of the second drum. The fourth adhesive layer 14b, different from the third adhesive layer 14a, does not include the convex portions 13

(selective adhesive region), and uses the entire fourth adhesive layer 14b to adhere to the device chips 17.

As shown in FIG. 6, the second drum 12 is moved to a position above the second substrate 10 using the drum mover, and then, the second drum 12 is lowered using the lifting and lowering device until the device chips 17 adhered to the second drum 12 come into contact with the second adhesive layer surface of the second substrate 10. Subsequently, while the second substrate 10 is moved in C-direction using the second traveling device 6 opposite to A-direction, the second drum 12 is being rotated in D-direction.

Alternatively, the second drum 12 may be positioned above the second substrate 10 by moving the second conveying table 4 using the second traveling device 6. In this configuration, if a relative positional relationship between the second drum 12 and the second substrate 10 can be established, whichever may be moved.

The angular speed of the second drum 12 is set so that the speed in a tangent line direction of the device chips 17 adhered to the second drum 12 that comes into contact with the second substrate 10 equals to a speed of the second substrate 10 moving in C-direction, and the second drum 12 is rotated in D-direction. In one example, when $V_D$ is given to the moving speed in C-direction of the second substrate 10, the above radius of the second drum 12 is $R_2$ and the angular speed of the second drum 12 may be set to $V_D/R_2$.

The angular speed of the second drum 12 may be set to a different angular speed from that of the above second drum 12 like a relationship between the angular speed of the first drum 11 and the moving speed of the first substrate 9, but the device chips 17 adhered to the second drum 12 have been already position-adjusted and aligned, and thus, the angular speed of the second drum 12 may be generally set to the angular speed of the above relationship.

Although the moving direction of the second substrate 10 represents C-direction in the above embodiment, the second substrate 10 may be moved in A-direction and the second drum 12 may be rotated in a direction opposite to D-direction. The relative positional relationship between the second drum 12 and the second substrate 10 is established, and thus, the rotational direction of the second drum 12 may be determined by matching with the moving direction of the second substrate 10. This may be also satisfied in the relationship between the first drum 11 and the first substrate 9, and it is not limited to the moving direction in each above embodiment.

Alternatively, the device chips 17 may be transferred to the second substrate 10 by moving the second drum 12 in parallel in A-direction while the second drum 12 is rotated in D-direction. However, the rotation device of the second drum 12 is operated independently of the second traveling device 6 to make the second substrate 10 move in parallel in a horizontal direction, and it does not cause each operation to be interfered and easily makes the distance in the vertical direction between the second drum 12 and the second substrate 10 to accurately kept constant.

As described above, the device chips 17 are transferred from the first substrate 9 to the second substrate 10 through the convex portions 13 of the first drum 11 and the second drum 12. It means that the arrangement of the device chips 17 on the second substrate 10 depends on the arrangement of the convex portions 13. The arrangement of the convex portions 13 can be adjusted as described above, and for example, the pitch of the device chips 17 may be widened or narrowed at the center portion of the second substrate 10.

Although the embodiment that the second drum 12 is brought into contact with the first drum 11 by parallel moving the second drum 12 to transfer the device chips 17 from the first drum 11 to the second drum 12 is described, the first drum 11 may include a drum mover and may be brought into contact with the second drum 12 by parallel moving the first drum 11 using the moving device.

In this way, the device chips 17 may be transferred from the second drum 12 to the second substrate 10 in a lump, and it may greatly reduce the tact time.

Additionally, the device chips 17 adhered to the convex portions 13 of the first drum 11 may be directly transferred onto the second substrate 10 without using the second drum 12 so that the front-and-rear relation for the surfaces of each device chip 17 on the second substrate 10 is made same to that of the device chip 17 on the first substrate 9. In this case, the first drum 11 may also include a drum mover.

When the second drum 12 is not used, it is understandable that the device chips 17 may be transferred onto the second substrate 10 by using the first drum 11 instead of the second drum 12 in the above description, and thus, the details are omitted.

Additionally, using the first drum 11 and the second drum 12 on different occasions, combining one transfer of only the first drum 11 with the other transfer of both of the first drum 11 and the second drum 12 and using them properly to transfer the device chips 17 allow the arrangement of each device chip 17 with different front-and-rear relations for the surfaces to selectively formed in a lump.

For example, the device chips 17 whose front-and-rear relation for the surfaces is inversed through the first drum 11 may be adhered from the first substrate 9 onto the second drum 12, then, the adhesive layer 14a having the convex portions 13 with a different type of arrangement may be attached to the first drum 11, the device chips 17 may be adhered from the first substrate 9 onto the convex portions 13 whose front-and-rear relation for the surfaces is not inversed of the first drum 11, and the device chips 17 may be sequentially transferred from the first drum 11 to the second substrate 10 and from the second drum 12 to the second substrate 10, or the device chips 17 may be also sequentially transferred in the opposite way.

Alternatively, the device chips 17 may be transferred from the first substrate 9 to the second substrate 10 through the first drum 11, then, the adhesive layer 14a having the convex portions 13 with a different type of arrangement may be attached to the first drum 11, and the device chips 17 may be transferred from the first substrate 9 to the second substrate 10 through the first drum 11 and the second drum 12, or the device chips 17 may be also transferred in the opposite way.

It may be determined whether the second drum 12 are necessary or not by comparing the mounting situations of the device chips 17 between the second substrate 10 and the first substrate 9. Examples are described below to easily make determination whether the second drum 12 are necessary or not, but it is not limited to.

For example, after the device chips 17 are transferred to the second substrate 10, the device chips 17 may be selected depending to a formation method of an electric wiring between electric terminals, such as a connection terminal for power and a connection terminal for electric signals, of the device chips 17 and electrical connection terminals of the other circuit on the second substrate 10.

In one example, when the device chips 17 are LEDs, when the light emitting surfaces are on an upper side (upper surface) of the first substrate 9, and when the LEDs include electric power supply terminals on the opposing surfaces, the front-and-rear relation for the surfaces of the LEDs may be inversed using the second drum 12, the surfaces with the electric power supply terminals of the LEDs may be positioned facing upward, then, conductive wiring may be formed, and the LEDs may be electrically connected to a switching circuit or the like positioned on the second substrate 10.

In the other example, when the device chips 17 are memory elements and electrical connection terminals, such as a connection terminal for power and a connection terminal for electric signals, are on the upper side of the first substrate 9, the memory elements may be transferred from the first drum 11 to the second substrate 10 without inversing the front-and-rear relation for the surfaces of the memory elements and without using the second drum 12.

The relationship of the adhesive forces against the device chips 17, as already described, is necessary to transfer the device chips 17 from the first substrate 9 to the first drum, to the second drum 12, and to the second substrate 10 sequentially as described above, wherein:

the adhesive force is getting stronger in the order of (adhesive force of the first adhesive layer of the first substrate 9)<(adhesive force of the selective adhesive region on the third adhesive layer 14a of the first drum)<(adhesive force of the fourth adhesive layer 14b of the second drum 12)< (adhesive force of the second adhesive layer of the second substrate 10). However, the second drum 12 may be not occasionally used. As described above, the selective adhesive region corresponds to the convex portions 13.

The adhesive force of the adhesive layer may be controlled by adjusting the blending ratios of materials for the adhesive layer.

The material of the adhesive layer may be selected from at least one or more combination selected from examples of known adhesive agents including acrylic-based adhesive, rubber-based adhesive, vinyl alkyl ether-based adhesive, silicone-based adhesive, polyester-based adhesive, polyamide-based adhesive, urethane-based adhesive, fluorine-based adhesive, epoxy-based adhesive, and polyether-based adhesive, but not limited to.

Additionally, the material of the adhesive layer may properly include one or more additive substance selected from examples of conditioner for viscosity and separation degree, tackifier agent, plasticizer, softener, filler (including fibrous glass, glass beads, metal powders, and the other inorganic powder, etc.), coloring agent (pigment and dye, etc.), and additive agent (pH adjuster, antioxidant, and ultraviolet absorber, etc.).

Table 1 shows examples of a result that blending of material compositions for the adhesive layer is changed and that the adhesive force and hardness are examined. As shown in Table 1, change of the blending can change the adhesive force. In addition to it, change of the blending can also change the hardness.

The hardness was measured according to JIS K 6253, and the adhesive force was measured according to JIS 0237.

TABLE 1

| Blending | Adhesive force [kg/cm²] | Hardness [°] |
|---|---|---|
| A | 0.36 | 60.0 |
| B | 0.46 | 43.0 |
| C | 0.73 | 27.7 |
| D | 0.83 | 42.7 |
| E | 0.92 | 35.3 |
| F | 0.74 | 14.7 |
| G | 0.85 | 16.7 |

When the adhesive layers are contacted each other, a resin having low hardness causes a deformation and deteriorates the placement accuracy of the device chips 17, and thus, a certain amount of hardness is necessary. A resin having high hardness tends to weaken the adhesive force, and thus, it should be carefully considered what type of resin is used also from the aspect of the adhesive force. When silicone-based resin is used in Table 1, for example, resin having desirable hardness can be selected preferably in a range of hardness 30 to 60.

In one example, "blending A" for the first adhesive layer of the first substrate 9, "blending B" for the third adhesive layer of the first drum 11, "blending D" for the fourth adhesive layer of the second drum 12, and "blending E" for the second adhesive layer of the second substrate 10 may be selected from combinations of the above adhesive force among the resins listed in Table 1.

Although thickness of each adhesive layer may be optionally set in the above range for example, preferably 5 to 100 µm, and more preferably 10 to 60 µm.

When the thickness of the adhesive layer is less than 5 µm, the adhesion tends to be lowered and a major change in ambient temperature may deteriorate its durability.

In one example, when an adhesive material is used for the first drum 11 including the adhesive layer whose thickness is less than 5 µm having the convex portions 13, (1) the convex portions 13 are formed on the position where the device chips 17 intended to taken-out are positioned, but the adhesive layer may be adhered to the device chips 17 that are not intended to taken-out (it depends on the pushing length), (2) when a primer layer or the like requires to be formed as a base during forming the adhesive layer, composition/performance of the adhesive layer may suffer effects from an infiltration of the primer layer, (3) if a thickness of a viscoelastic body layer configuring the adhesive layer is too thin, recess in a thickness direction (dispersion of stresses) cannot be ensured, and thus, the pushing stresses may be increased and it may cause the device chips 17 to be damaged or may deform the convex portions 13, and (4) the limit of accuracy of the apparatus is concerned.

Additionally, when the second drum 12 is used, the above (2), (3), and (4) are concerned.

On the other hand, when a thickness of the adhesive layer is more than 100 µm, some problems, such as air bubbles remained when the composition for the adhesive material is coated and dried and ununiformity in thickness over the adhesive layer surface, may cause an adhesiveness to be deteriorated.

In the other example, when an adhesive material is used for the first drum 11 including the adhesive layer whose thickness is more than 100 µm having the convex portions 13, (1) if a thickness of the adhesive layer is too thick a reaction force against pushing is decreased, imprinting required to take-out the device chips 17 is also decreased, it may cause failing to taking out the device chips 17, and thus, the pushing length requires to be ensured long, (2) furthermore, if the pushing length is ensured long, it may increase the deformation quantity and may deteriorate a positional accuracy for the device chips 17.

Additionally, since a height of each convex portion 13 is related to a ground area, the aspect ratio is preferably equal to or less than 4. The positional accuracy for the device chips 17 is affected by the deformation or the like of the convex portions 13.

Considering the positional accuracy, preferably for the form of each convex portion 13, the height is 5 to 60 µm, the aspect ratio is equal to or less than 4, and the lateral sides are not vertical and the taper angles are 20 to 80 degrees. If an especially high positional accuracy (e.g. single micrometer order) desires to be achieved, preferably for the best form of each convex portion 13, the height is 10 to 40 µm, the aspect ratio is 2 to 3, and the taper angles of the lateral sides are 30 to 60 degrees.

The form of each convex portion 13 is properly selected from the above range in consideration of shapes or physical properties (hardness, surface state, or the like), etc. of the device chips that are subject to be transferred also other than the positional accuracy.

As described above, for the selective adhesive region, the arrangement of the convex portions 13 may not only determine the arrangement portions for the device chips, but also may optimize the configuration of the selective adhesive region so as to adapt to the device chips.

Furthermore, during a process for forming the adhesive layer, a thick adhesive layer typically may cause "sink" due to the shrinkage of a resin when cured (volumetric shrinkage), its shape stability may be lowered, a risk that air bubbles mix into the adhesive layer may be increased, and they may be problems.

In one example, a vacuum agitation technology may be used when the material is mixed to prevent air bubbles or the like, and an influx property of the material against the matrix (concave plate) is controlled based on the contact angles with interface.

However, a thin adhesive layer may cause cissing/deviation due to the surface tension. If a primer layer is formed to ensure adhesion, the primer layer may affect the composition of the adhesive layer by leading to, for example, diffluence and infiltration.

Additionally, the device chips 17 may be firmly fixed by forming UV curing resin or the like on the device chip 17 and the second substrate 10 after the device chips 17 are positioned on the second substrate 10.

Second Embodiment

A second embodiment will be described below.

In one example, when LEDs are transferred, a circular wafer used for a semiconductor process is used for manufacturing device chips to be adhered to the first substrate 9. When the wafer is made of silicon single crystalline, the wafer of 4 to 8 inch or 12 inch at the maximum is often used. When the wafer is made of group III-V compound semiconductor, the wafer of 3 to 4 inch is often used. The size of the first substrate 9 is determined according to the size of the wafer. On the other hand, the second substrate 10 may be a display apparatus with a large screen (e.g. diagonal length is 50 inch).

Even if the size of the first substrate 9 is greatly different from the size of the second substrate 10, and particularly even if the size (width) of the second substrate 10 is larger than the size of the first substrate 9, the embodiments of the present invention can effectively work.

Figure 7A:
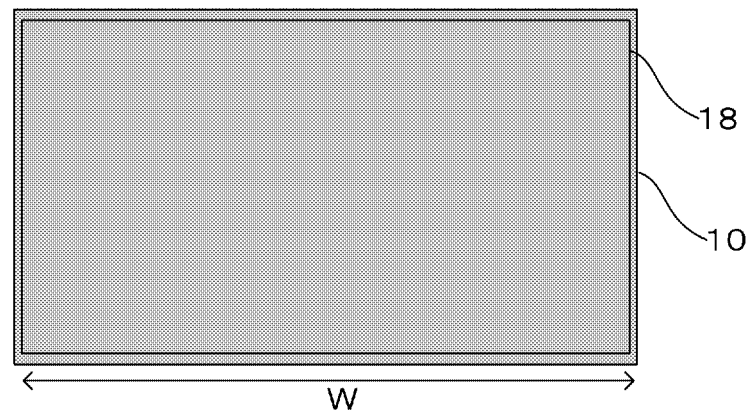
FIGS. 7A, 7B and 7C are plan views of the apparatus in an operation state according to a second embodiment of the present invention.
Figure 7B:
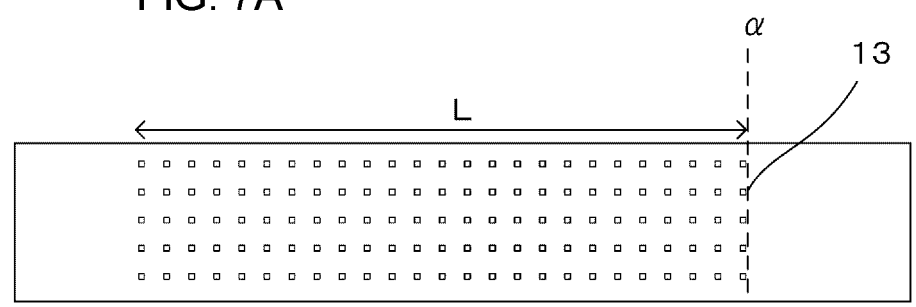

As shown FIG. 7B, L is a length in a direction of the rotation shaft 15 and is the length of an area in the first drum 11 where the convex portions 13 are formed, and, as shown in FIG. 7A, W is a width (length in a direction parallel to the rotation shaft 15) of the second substrate 10 where the device chips 17 are to be transferred. The length L is set to equal to or greater than the width W.

Figure 7C:
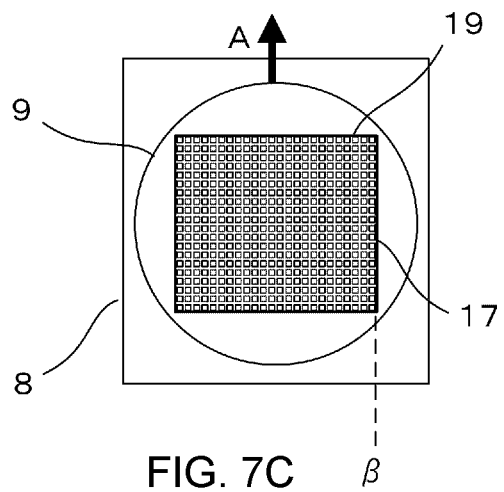

As shown in FIGS. 7B and 7C, one end of the convex portions 13 in the first drum 11, that is, one right end (dotted line cc) is aligned with the other right end (dotted line β) of a separating area where some of the device chips 17 formed on the first substrate 9 are positioned to be separated for being transferred. In other words, the first substrate 9 is moved in A-direction, and is position-adjusted so as to adhere to one end of the convex portions 13 when the first drum 11 is rotated.

The traversing device 8 enables the first substrate 9 in longitudinal and parallel directions of the rotation shaft 15 of the first drum 11, and thus, the first substrate 9 can be position-adjusted.

The above physical relationship between the convex portions 13 and the first substrate 9 (dotted lines α and β) is a mere example, and the physical relationship may be properly defined according to the arrangement of the convex portions 13 and the first substrate 9, the form of each convex portion 13, and the shapes of the device chips 17. It allows the convex portions 13 to take-out the device chips 17 positioned in the predetermined area.

The form of each convex portion 13 may be changed according to, for example, the shape of each device chip 17, they may be the same, and examples of the form and shape includes circular, oval, and rectangular. The area in the convex portions 13 where one device chip 17 correspond may be formed either by one convex portion 13 or by the plurality of convex portions 13. The contact surface of the convex portion 13 may be larger or narrower than that of the device chip 17. For example, when the contact surface of the convex portion 13 is narrower than that of the device chip 17, the dotted line β may be shifted to left side in FIG. 7C, and when the contact surface of the convex portion 13 is larger than that of the device chip 17, the dotted line β may be shifted to right side in FIG. 7C.

Subsequently, the convex portions 13 of the first drum 11 is lowered until the convex portions 13 comes into contact with the surfaces of the device chips 17 on the first substrate 9. While the first substrate 9 is moved in A-direction, the first drum 11 is rotated and the device chips 17 on the first substrate 9 is made to be selectively adhered to the convex portions 13. The relationship between the rotational speed of the first drum 11 and the moving speed and direction of the first substrate 9 are as described in the first embodiment of the present invention.

Figure 8A:
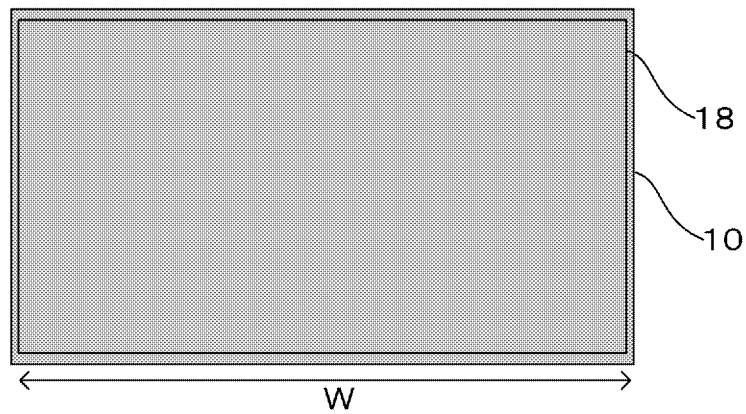
FIGS. 8A, 8B and 8C are other plan views of the apparatus in an operation state according to the second embodiment of the present invention.
Figure 8B:
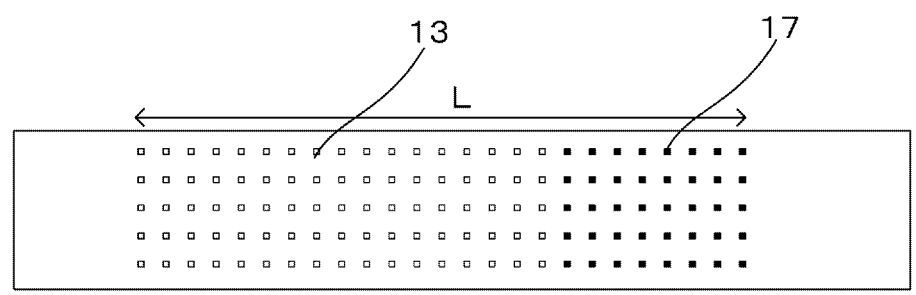
Figure 8C:
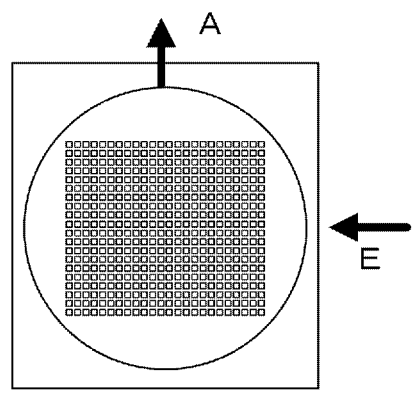

As shown in FIGS. 8A, 8B and 8C, the first drum 11 is raised, and the first substrate 9 is returned to the original position where the first substrate 9 was positioned before the adhering of the device chips 17 was started. The first substrate 9 is then moved in E-direction (that is, parallel to a longitudinal direction of the rotation shaft 15 of the first drum 11) by a distance corresponding to a width of an area (separate-area 19) where the device chips 17 to be separated from the first substrate 9 are positioned, and the E-direction is a direction toward the area in the convex portions 13 of the first drum 11 where the device chips 17 have not been adhered. As described below, the first substrate 9 is moved further by a distance (pitch) so as to allowing the device chips 17 to be transferred, and the first drum 11 is rotated to a position where the convex portions 13 where the device chips 17 have not been adhered are allowed to start transferring the next device chips 17.

Figure 9A:
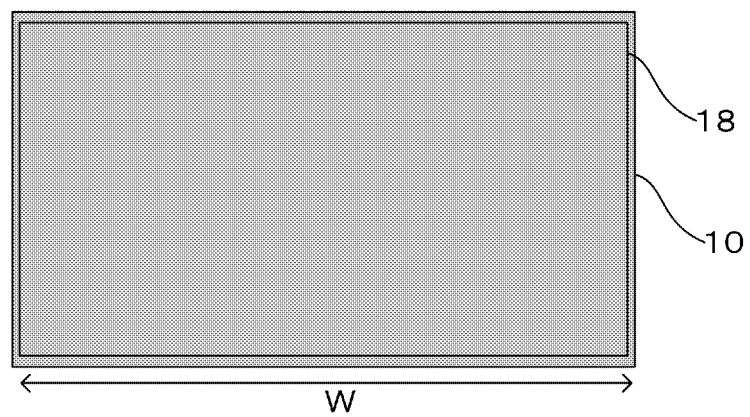
FIGS. 9A and 9B are other plan views of the apparatus in an operation state according to the second embodiment of the present invention.
Figure 9B:
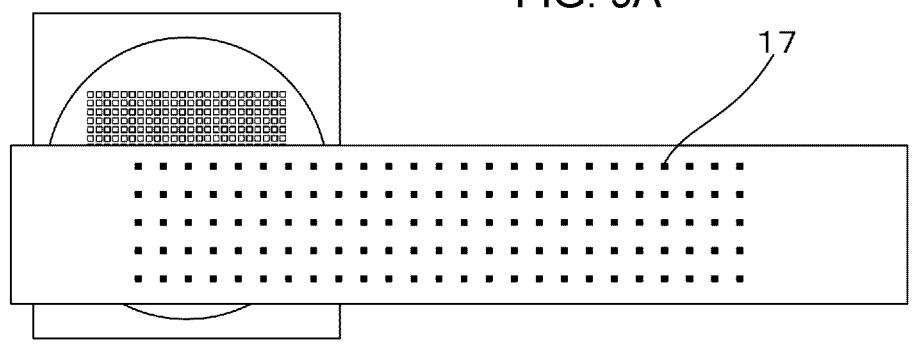

Subsequently, the above process, the separating of the device chips 17 using the first drum 11, the rotating of the first drum 11, and the moving of the first substrate 9 (see FIGS. 8A, 8B and 8C) are repeated, and as shown in FIGS. 9A and 9B, the device chips 17 are made to be adhered to the area where all the convex portions 13 of the first drum 11 are positioned or the area where the convex portions 13 intended to be transferred to the second substrate 19 are positioned.

For transferring the device chips 17 to the plurality kinds of the second substrates 10 for product having different sizes, the first drum 11 having the convex portions 13 corresponding to the product, which is considered to be the largest, may be prepared. Subsequently, a partial area of the above convex portions 13 of the drum 11 may be also used for smaller sized product. This allows the third adhesive layer 14a of the single first drum 11 to be used to produce a plurality kinds of electronic device products.

Subsequently, in the same way as in the first embodiment, the device chips 17 adhered to the convex portions 13 of the first drum 11 are transferred to the second drum 12, and the device chips 17 adhered to the second drum 12 are transferred onto the second substrate 10.

As described in the first embodiment, the device chips 17 may be transferred from the first drum 11 to the second substrate 10 without using the second drum 12.

Additionally, the device chips 17 including a different front-and-rear relation for the surfaces may be properly transferred by combining one process of transferring the device chips 17 using only the first drum 11 with the other process of transferring the device chips 17 using both of the first drum 11 and the second drum 12.

According to the above embodiment of the present invention, the device chips 17 may be transferred multiple times from the first substrate 9 to the first drum 11. In a first transferring process, the device chip 17 is transferred from the first substrate 9 to the first drum 11, and the above device chip 17 transferred disappear on the first substrate 9 after the above transferring. In the next transferring process, in order to transfer the device chip 17 from the first substrate 9 to the first drum 11, the first substrate 9 will be position-adjusted and shifted by one pitch for the device chips 17 on the first substrate 9 in one example.

With reference to FIGS. 10A to 10C, a positional adjustment of the first substrate 9 required for transferring the device chips 17 multiple times will be described below. Each device chip 17 is assumed to be positioned on each intersection of an equal-distance grid to simplify the description. FIGS. 10A to 10C are plan views of a transferring process of the device chips 17 on the first substrate 9: wherein "X-axis" is given to one direction parallel to A-direction and "Y-axis" is given to the other direction perpendicular to A-direction.

As shown in FIG. 10A, m pieces of device chips 17 in X-direction and n pieces of device chips 17 are assumed as one unit. Both of "m" and "n" are positive integers, and one of them is an integer larger than one. One unit includes m×n pieces of device chips 17. When the device chips 17 are transferred from the first substrate 9 to the first drum 11 only once, both of m and n may also be one.

As shown in FIG. 10B, for a first transferring process, one device chip 17 is transferred from each unit, that is, from the first substrate 9 to the first drum 11.

As shown FIG. 10C, for a second transferring process, after the first substrate 9 is moved by a distance corresponding to a width of the separating area 19, the first substrate 9 is moved by one pitch for the device chips 17 in X- or Y-direction, and the device chip 17 (in each unit) is transferred from the first substrate 9 to the first drum 11. FIG. 10C shows one example where the device the device chip 17 is transferred after the first substrate 9 is moved by one pitch in X-direction.

Likewise, the device chip 17 may be transferred one by one from each unit including m×n pieces of device chips 17 to the first drum 11.

Additionally, although the first substrate 9 is moved in X-direction in FIGS. 10A to 10C, the first substrate 9 may be moved in X-direction or may be moved by one pitch in both of X- and Y-directions. If the first substrate 9 is moved within the unit including m×n pieces of the device chips 17, the first substrate 9 may be moved by more than one pitch and the device chips 17 positioned in the intended area may be properly transferred.

One example that the device chips 17 are arranged on the equal-distance grid is described above, but for the device chips 17 arranged according to a predetermined rule, the plurality of device chips 17 may configured to be one unit. Consequently, a plurality of repetitions of transferring from the first substrate 9 to the first drum 11 enable the intended number of the device chips 17 to be transferred (adhered). The intended number means the number of device chips 17 intended to be transferred to the second substrate 10.

Additionally, one example of a systematic method (process) is described above for transferring the device chips 17 multiple times, but it is not limited to. The first substrate 9 may be also properly moved for transferring the device chips 17 multiple times.

For transferring more device chips 17 to the convex portions 13, the plurality of first substrates 9 may be also prepared and properly replaced. Different kinds of device chips 17 are adhered to each first substrate 9, the different kinds of device chips 17 may be transferred from to the single first drum 11 using the plurality of first substrates 9.

Even in this case, the device chips 17 may be transferred to a large-screen display apparatus, and also the transferring from the first drum 11 to the second drum 12 or transferring from the second drum 12 to the second substrate 10 may be performed in a lump. This may shorten the tact time, and thus, may also reduce the manufacturing cost.

REFERENCE SIGNS LIST 1. apparatus base
2. traveling guide
3. first conveying table
4. second conveying table
5. first traveling device
6. second traveling device
7. alignment device
8. traversing device
9. first substrate
10. second substrate
11. first drum
12. second drum
13. convex portions
14a. third adhesive layer
14b. fourth adhesive layer
15. rotation shaft
16. rotation shaft
17. device chip
18. transfer-area
19. separate-area
20. alignment device

The invention claimed is:
1. A method of manufacturing electronic devices comprising:
  a preparation step for preparing a first substrate having a first adhesive layer and a second substrate having a second adhesive layer, the first adhesive layer including a surface where a plurality of device chips are adhered;
a first take-out step for making at least part of the device chips on the first substrate come into contact with and adhere to at least part of a selective adhesive region on a third adhesive layer of a first drum and for separating the at least part of the device chips from the first substrate by rotating the first drum; and
a first transfer step for making the device chips on the selective adhesive region come into contact with and adhere to the second adhesive layer and for separating the device chips from the selective adhesive region by rotating the first drum.

2. The method of manufacturing electronic devices according to claim 1,
wherein an adhesion force between the first adhesive layer and the device chips is weaker than an adhesion force between the selective adhesive region and the device chips, and
wherein the adhesion force between the selective adhesive region and the device chips is weaker than an adhesion force between the second adhesive layer and the device chips.

3. A method of manufacturing electronic devices comprising:
a preparation step for preparing a first substrate having a first adhesive layer and a second substrate having a second adhesive layer, the first adhesive layer including a surface where a plurality of device chips are adhered;
a first take-out step for making at least part of the device chips on the first substrate come into contact with and adhere to at least part of a selective adhesive region on a third adhesive layer of a first drum and for separating the at least part of the device chips from the first substrate by rotating the first drum;
an inversion step for making the device chips on the selective adhesive region of the first drum come into contact with and adhere to a fourth adhesive layer of a second drum and for separating the device chips from the selective adhesive region by rotating the first drum and the second drum oppositely to each other; and
a second transfer step for making the device chips come into contact with and adhere to the second adhesive layer and for separating the device chips from the second drum by rotating the second drum.

4. The method of manufacturing electronic devices according to claim 3,
wherein an adhesion force between the first adhesive layer and the device chips is weaker than an adhesion force between the selective adhesive region and the device chips,
wherein the adhesion force between the selective adhesive region and the device chips is weaker than an adhesion force between the fourth adhesive layer and the device chips, and
wherein the adhesion force between the fourth adhesive layer and the device chips is weaker than an adhesion force between the second adhesive layer and the device chips.

5. A method of manufacturing electronic devices, comprising:
a preparation step for preparing a first substrate having a first adhesive layer and a second substrate having a second adhesive layer, the first adhesive layer including a surface where a plurality of device chips are adhered; and
a first transfer process and a second transfer process;
wherein:
the first transfer process comprises:
a first take-out step for making at least part of the device chips on the first substrate come into contact with and adhere to at least part of a selective adhesive region on a third adhesive layer of a first drum and for separating the at least part of the device chips from the first substrate by rotating the first drum; and
a first transfer step for making the device chips on the selective adhesive region come into contact with and adhere to the second adhesive layer and for separating the device chips from the selective adhesive region by rotating the first drum; and
the second transfer process comprises:
a second take-out step for making at least part of the device chips on the first substrate come into contact with and adhere to at least part of a selective adhesive region on a third adhesive layer of a first drum and for separating the at least part of the device chips from the first substrate by rotating the first drum; and
an inversion step for making the device chips on the selective adhesive region of the first drum come into contact with and adhere to a fourth adhesive layer of a second drum and for separating the device chips from the selective adhesive region by rotating the first drum and the second drum oppositely to each other; and
a second transfer step for making the device chips come into contact with and adhere to the second adhesive layer and for separating the device chips from the second drum by rotating the second drum.

6. The method of manufacturing electronic devices according to claim 1, comprising:
the first take-out step; and
further a parallel-move step for separating the first drum from the first substrate after the first take-out step and for moving the first substrate in a direction parallel to a rotation shaft of the first drum,
wherein the first take-out step and the parallel moving step are repeated several times, so as to transfer the device chips to the selective adhesive region of the first drum.

7. The method of manufacturing electronic devices according to claim 1, wherein the selective adhesive region comprises convex portions.

8. An apparatus for manufacturing electronic devices comprising: a traveling guide; a first conveying table; a second conveying table; and a first drum,
wherein the first conveying table includes:
a first traveling device that makes the first conveying table move on the traveling guide; and
a traversing device that moves perpendicularly to a longitudinal direction of the traveling guide,
wherein the second conveying table includes a second traveling device that makes the second conveying table move on the traveling guide, and
wherein the first drum includes:
a first rotation shaft;
a first elevating device for raising and lowering the first drum;
a first rotation device for rotating the first drum around the first rotation shaft; and
a mechanism for controlling a tilt angle of the first rotation shaft in a direction parallel to a first direction perpendicular to the first conveying table and a direction parallel to a second direction parallel to the first conveying table, and further includes a third adhesive layer having a selective adhesive region.

9. The apparatus for manufacturing electronic devices according to claim 8, further comprising a second drum, wherein the second drum includes:
 a second rotation shaft;
 a second elevating device for raising and lowering the second drum; and
 a second rotation device for rotating the second drum around the second rotation shaft,
wherein at least one of the first drum and the second drum has a drum mover, and the drum mover moves in a direction parallel to a longitudinal direction of the traveling guide, and
wherein the second drum includes a fourth adhesive layer, and an adhesion force of the selective adhesive region is weaker than an adhesion force of the fourth adhesive layer.

10. The apparatus for manufacturing electronic devices according to claim 8, wherein the selective adhesive region comprises convex portions.

\* \* \* \* \*